United States Patent
Guha et al.

(10) Patent No.: US 9,230,968 B2
(45) Date of Patent: Jan. 5, 2016

(54) METHODS OF FORMING MEMORY ARRAYS AND SEMICONDUCTOR CONSTRUCTIONS

(71) Applicant: Micron Technology, Inc., Boise, ID (US)

(72) Inventors: Jaydip Guha, Boise, ID (US); Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/569,337

(22) Filed: Dec. 12, 2014

(65) Prior Publication Data

US 2015/0206886 A1 Jul. 23, 2015

Related U.S. Application Data

(63) Continuation of application No. 13/591,074, filed on Aug. 21, 2012, now Pat. No. 8,946,018.

(51) Int. Cl.

| | |
|---|---|
| *H01L 27/108* | (2006.01) |
| *H01L 27/102* | (2006.01) |
| *H01L 27/105* | (2006.01) |
| *H01L 21/8222* | (2006.01) |
| *H01L 21/8229* | (2006.01) |
| *H01L 21/8234* | (2006.01) |
| *H01L 21/02* | (2006.01) |
| *H01L 21/265* | (2006.01) |
| *H01L 21/324* | (2006.01) |
| *H01L 29/04* | (2006.01) |

(Continued)

(52) U.S. Cl.
CPC ...... *H01L 27/10876* (2013.01); *H01L 21/0257* (2013.01); *H01L 21/02532* (2013.01); *H01L 21/02598* (2013.01); *H01L 21/26513* (2013.01); *H01L 21/324* (2013.01); *H01L 21/8222* (2013.01); *H01L 21/8229* (2013.01); *H01L 21/823487* (2013.01); *H01L 27/1021* (2013.01); *H01L 27/1022* (2013.01); *H01L 27/1052* (2013.01); *H01L 27/1085* (2013.01); *H01L 27/10894* (2013.01); *H01L 27/10897* (2013.01); *H01L 29/04* (2013.01); *H01L 29/16* (2013.01); *H01L 29/6609* (2013.01); *H01L 29/66272* (2013.01); *H01L 29/66666* (2013.01); *H01L 27/0814* (2013.01); *H01L 27/0823* (2013.01); *H01L 29/732* (2013.01); *H01L 29/868* (2013.01)

(58) Field of Classification Search
CPC ............ H01L 27/1021; H01L 21/8229; H01L 27/10876
USPC .................................................. 438/237, 478
See application file for complete search history.

(56) References Cited

U.S. PATENT DOCUMENTS

| | | |
|---|---|---|
| 4,651,184 A | 3/1987 | Malhi |
| 6,566,194 B1 | 5/2003 | Ramsbey et al. |

(Continued)

*Primary Examiner* — Christine Enad
(74) *Attorney, Agent, or Firm* — Wells St. John P.S.

(57) ABSTRACT

Some embodiments include methods of forming semiconductor constructions. A heavily-doped region is formed within a first semiconductor material, and a second semiconductor material is epitaxially grown over the first semiconductor material. The second semiconductor material is patterned to form circuit components, and the heavily-doped region is patterned to form spaced-apart buried lines electrically coupling pluralities of the circuit components to one another. At least some of the patterning of the heavily-doped region occurs simultaneously with at least some of the patterning of the second semiconductor material.

24 Claims, 9 Drawing Sheets

(51) Int. Cl.
  *H01L 29/16* (2006.01)
  *H01L 29/66* (2006.01)
  *H01L 27/08* (2006.01)
  *H01L 27/082* (2006.01)
  *H01L 29/732* (2006.01)
  *H01L 29/868* (2006.01)

(56) References Cited

U.S. PATENT DOCUMENTS

| | | | |
|---|---|---|---|
| 6,677,204 B2 * | 1/2004 | Cleeves et al. | 438/268 |
| 6,870,268 B2 | 3/2005 | Lee et al. | |
| 6,989,560 B2 | 1/2006 | Koike et al. | |
| 2001/0010957 A1 * | 8/2001 | Forbes et al. | 438/248 |
| 2003/0235963 A1 | 12/2003 | Lindsay et al. | |
| 2006/0226463 A1 * | 10/2006 | Forbes | 257/301 |
| 2006/0261418 A1 | 11/2006 | Eitan et al. | |
| 2008/0150006 A1 | 6/2008 | Kwan et al. | |
| 2010/0084714 A1 | 4/2010 | Lim et al. | |
| 2011/0062557 A1 | 3/2011 | Bandyopadhyay et al. | |
| 2012/0087181 A1 * | 4/2012 | Lung et al. | 365/163 |
| 2012/0135580 A1 * | 5/2012 | Scheuerlein et al. | 438/381 |
| 2013/0234280 A1 * | 9/2013 | Kumar et al. | 257/506 |

* cited by examiner

METHODS OF FORMING MEMORY ARRAYS AND SEMICONDUCTOR CONSTRUCTIONS

RELATED PATENT DATA

This patent resulted from a Continuation of U.S. patent application Ser. No. 13/591,074 which was filed Aug. 21, 2012 and which is incorporated by reference herein.

TECHNICAL FIELD

Methods of forming memory arrays and semiconductor constructions.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example type of memory is dynamic random access memory (DRAM). A DRAM unit cell may comprise a transistor in combination with a capacitor. The capacitor may be considered to be a data storage device in that the charge state of the capacitor corresponds to a memory state of the memory cell.

Some memory comprises unit cells having programmable material between a pair of electrodes. The programmable material has two or more selectable resistive states to enable storing of information, and thus the memory unit cells are data storage devices. Examples of such memory cells are resistive RAM (RRAM) cells, phase change RAM (PCRAM) cells, and programmable metallization cells (PMCs)—which may be alternatively referred to as a conductive bridging RAM (CBRAM) cells, nanobridge memory cells, or electrolyte memory cells. The memory cell types are not mutually exclusive. For example, RRAM may be considered to encompass PCRAM and PMCs.

The unit cells comprising programmable material may be leaky, and accordingly select devices (i.e., access devices) may be provided to improve the control of current to and from the unit cells. The select devices may be any of numerous devices, including, for example, diodes, switches, field effect transistors, bipolar junction transistors (BJTs), etc.

Difficulties may be encountered in the fabrication of integrated circuitry, such as memory. Accordingly, it is desired to develop new methods of forming integrated circuitry.

DETAILED DESCRIPTION OF THE ILLUSTRATED EMBODIMENTS

Figure 1:
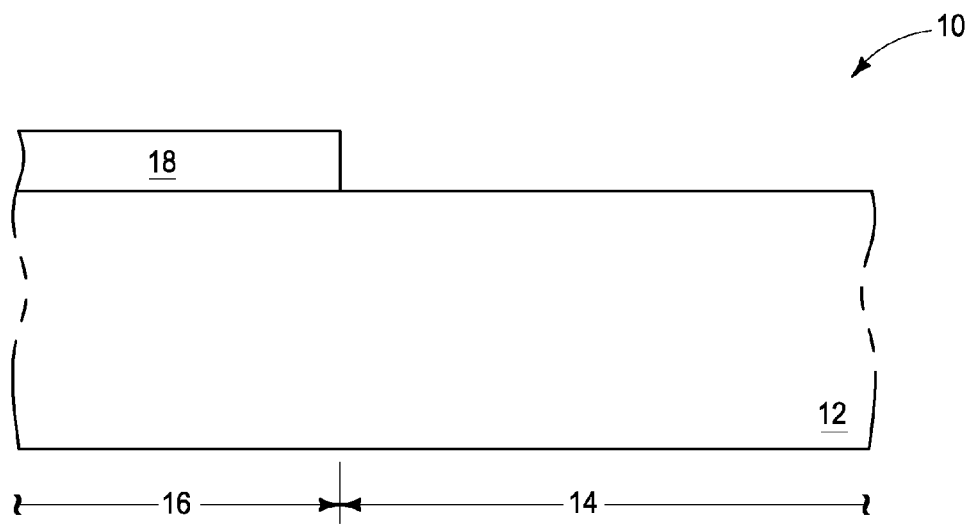
FIG. 1 is a diagrammatic cross-sectional view of a portion of a semiconductor construction showing an initial process stage of an example embodiment method for forming a heavily-doped region and epitaxially-grown semiconductor material over a memory array region selectively relative to a region peripheral to the memory array region.

Some embodiments include new methods of forming integrated circuitry in which a heavily-doped region (i.e., a region having a dopant concentration of at least about $10^{20}$ atoms/$cm^3$) is formed within a first semiconductor material, and then second semiconductor material is epitaxially grown over the first semiconductor material. The second semiconductor material may be patterned into integrated circuit components, and the heavily-doped region may be patterned into conductive lines that interconnect pluralities of the components to one another. In some embodiments, the heavily-doped region is formed within a memory array region of a semiconductor substrate. In such embodiments, buried conductive lines (for instance, buried digit lines) may be patterned from the heavily-doped region, and memory components may be patterned from the second semiconductor material. Pluralities of the memory components may be interconnected with one another through the buried conductive lines.

The symbols "+" and "−" are utilized in various figures of this disclosure to indicate dopant levels. Some or all of the designations p−−, p−, p, p+, p++, n−−, n−, n, n+ and n++ may be used to indicate various levels and types of doping. The difference in dopant concentration between the regions identified as being p++, p+, p, p−, and p−− may vary depending on the particular material being doped. An example dopant concentration of a p++ region is a dopant concentration of at least about $10^{20}$ atoms/$cm^3$ (and in some example applications may be from about $10^{20}$ atoms/$cm^3$ to about $10^{22}$ atoms/$cm^3$), an example dopant concentration of a p+ region is a dopant concentration of at least about $10^{19}$ atoms/$cm^3$ (and in some example applications may be from about $10^{19}$ atoms/$cm^3$ to about $10^{20}$ atoms/$cm^3$), an example dopant concentration of a p region is from about $10^{18}$ to about $10^{19}$ atoms/$cm^3$, an example dopant concentration of a p− region is less than about $5\times10^{18}$ atoms/$cm^3$, and an example dopant concentration of a p−− region is less than about $1\times10^{16}$ atoms/$cm^3$. The regions identified as being n−−, n−, n, n+ and n++ may have dopant concentrations similar to those described above relative to the p−−, p−, p, p+, and p++ regions, respectively. A region doped to p++ or n++ dopant concentration may be referred to as a "heavily-doped" region in the claims which follow.

The terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the terms "p-type doped" and "n-type doped" refer to dopant types of regions and not to relative dopant levels. Thus, a p-type doped region can be doped to any of the p++, p+, p, p− and p−− dopant levels discussed above, and similarly an n-type doped region can be doped to any of the n++, n+, n, n− and n−− dopant levels discussed above.

FIG. 1 shows a semiconductor construction 10 comprising a base 12. Base 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc.

The base 12 is shown to comprise a memory array region 14, and another region 16 peripheral to the memory array region. In subsequent processing, integrated memory may be formed across the memory array region, and logic or other circuitry may be formed across the peripheral region. In some embodiments, at least some of the circuitry formed across the peripheral region may be utilized for controlling current flow to and from memory cells of the memory array region during programming and/or reading operations.

A patterned masking material 18 is provided over the peripheral region 16. The masking material may comprise any suitable composition or combination of compositions. For instance, the masking material may comprise photolithographically-patterned photoresist and/or may comprise silicon nitride over pad oxide.

Figure 2:
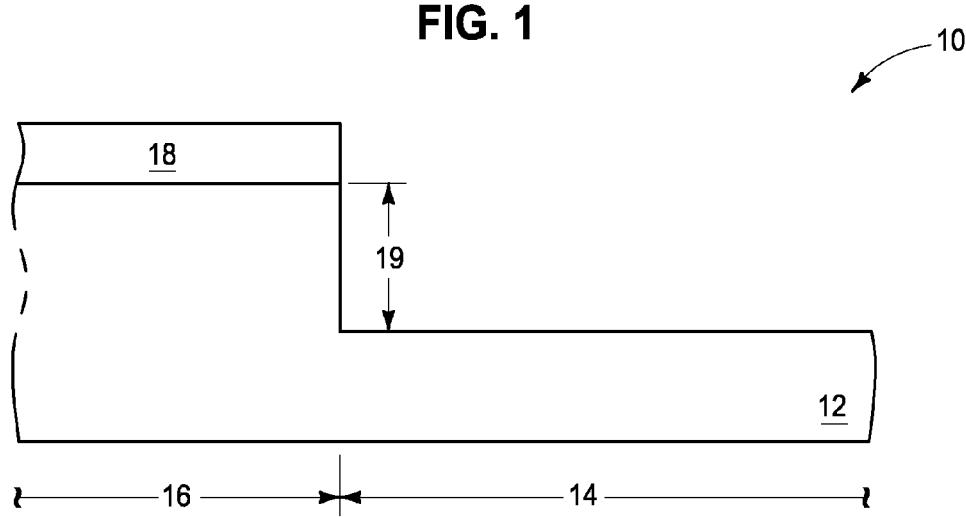
FIG. 2 is a diagrammatic cross-sectional view of the portion of the semiconductor construction shown in FIG. 1 showing a process stage subsequent to that shown in FIG. 1 for the example embodiment method for forming a heavily-doped region and epitaxially-grown semiconductor material over a memory array region selectively relative to a region peripheral to the memory array region.

Referring to FIG. 2, the memory array region 14 is recessed relative to the peripheral region 16. Such recessing may be accomplished by etching into the memory array region 14 while the peripheral region is protected with the masking material 18. Such etch may utilize any suitable chemistry. For instance, if the base 12 comprises monocrystalline silicon, the etch may utilize one or more fluorine-containing materials.

The memory array region is recessed to a depth 19. Such depth may be any suitable depth for the particular circuitry ultimately to be formed across the memory array region; and in some embodiments may be a depth of at least about 2000 Å.

Figure 3:
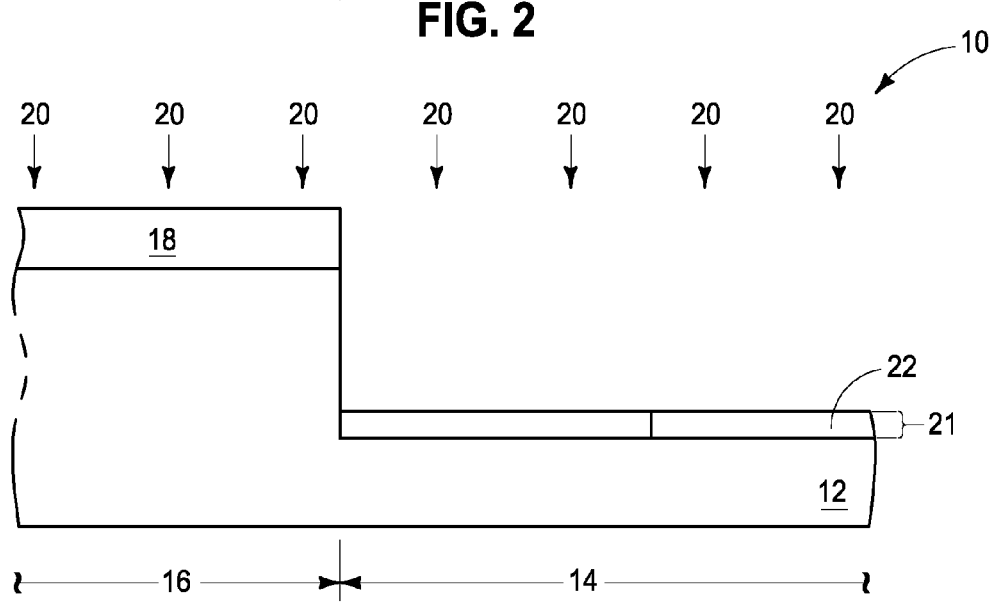
FIG. 3 is a diagrammatic cross-sectional view of the portion of the semiconductor construction shown in FIG. 1 showing a process stage subsequent to that shown in FIG. 2 for the example embodiment method for forming a heavily-doped region and epitaxially-grown semiconductor material over a memory array region selectively relative to a region peripheral to the memory array region.

Referring to FIG. 3, dopant 20 is implanted into construction 10 to form a heavily-doped region 22 within the memory array region 14. In the shown embodiment, masking material 18 remains over the peripheral region during the implant of dopant 20 and functions as a protective mask to prevent the dopant from being implanted into the peripheral region. The region 22 may be majority p-type doped in some embodiments, and may be majority n-type doped in other embodiments. If the region 22 is to be n-type doped, the implanted conductivity-enhancing dopant may comprise, for example, one or both of phosphorus and arsenic; and if the region 22 is to be p-type doped, the implanted conductivity-enhancing dopant may comprise, for example, boron.

Region 22 extends to a depth 21 within base 12. Such depth may be any suitable depth, and in some embodiments may be less than or equal to about 100 nanometers.

The implant of dopant 20 into base 12 may create damage within the base. A thermal anneal may be conducted to heal at least some of such damage. Such thermal anneal may comprise any suitable processing including, for example, rapid thermal processing (RTP) or a conventional furnace heat treatment.

The dopant 20 may comprise one or both of nitrogen and carbon in addition to the conductivity-enhancing dopant. The implanting of nitrogen and/or carbon within region 22 may reduce diffusion (i.e., spread) of conductivity-enhancing dopant during the thermal treatment.

Figure 4:
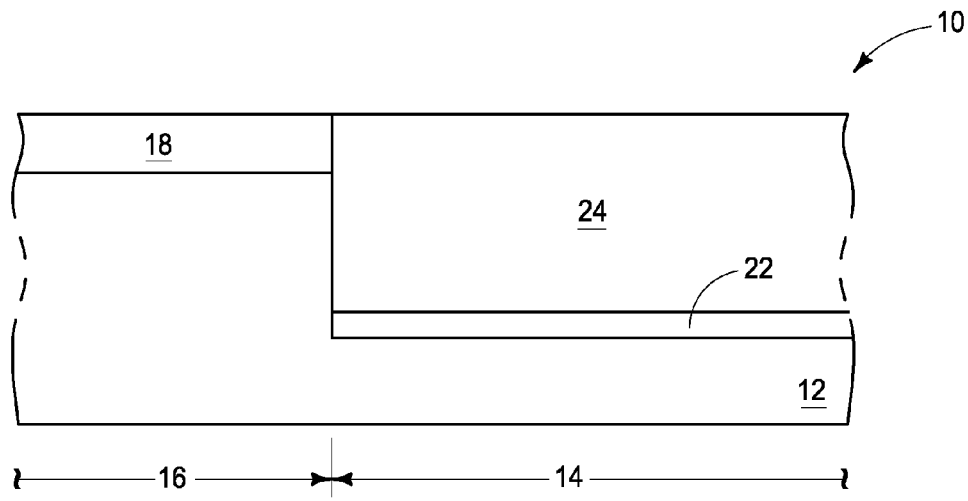
FIG. 4 is a diagrammatic cross-sectional view of the portion of the semiconductor construction shown in FIG. 1 showing a process stage subsequent to that shown in FIG. 3 for the example embodiment method for forming a heavily-doped region and epitaxially-grown semiconductor material over a memory array region selectively relative to a region peripheral to the memory array region.

Referring to FIG. 4, semiconductor material 24 is epitaxially grown from the exposed surface of material 12. In the shown embodiment, masking material 18 covers the peripheral region of base 12 during the epitaxial growth of semiconductor material 24, and thus precludes epitaxial growth over the peripheral region.

In some embodiments, semiconductor material of base 12 may be referred to as a first semiconductor material, and the semiconductor material 24 may be referred to as a second semiconductor material. The second semiconductor material may comprise a same composition as the first semiconductor material, or may comprise a different composition from the first semiconductor material. In some embodiments, both the first semiconductor material of base 12 and the second semiconductor material 24 comprise, consist essentially of, or consist of monocrystalline silicon.

The epitaxially grown material 24 may be in situ doped during the growth of such material, as discussed in more detail below with reference to FIG. 10.

Figure 5:
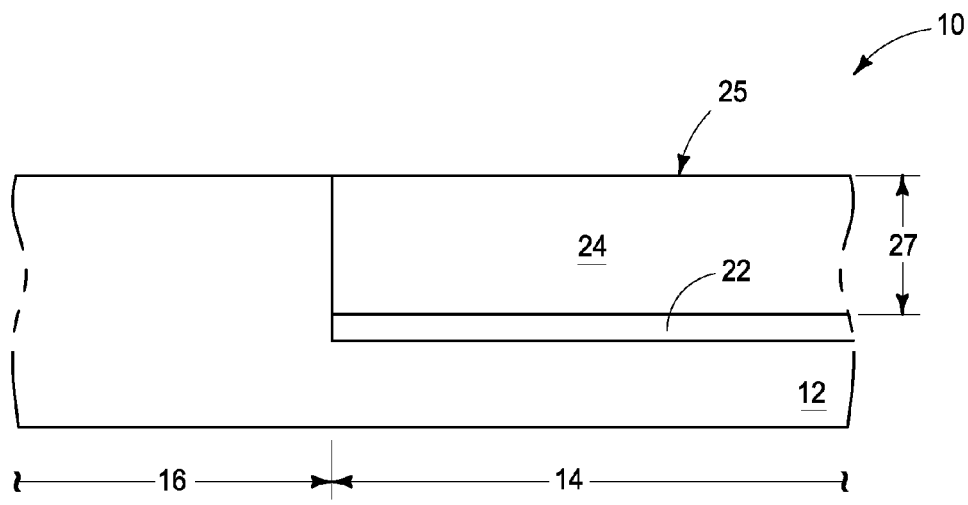
FIG. 5 is a diagrammatic cross-sectional view of the portion of the semiconductor construction shown in FIG. 1 showing a process stage subsequent to that shown in FIG. 4 for the example embodiment method for forming a heavily-doped region and epitaxially-grown semiconductor material over a memory array region selectively relative to a region peripheral to the memory array region.

Referring to FIG. 5, construction 10 is subjected to planarization (for instance, chemical-mechanical polishing (CMP)) to remove masking material 18 and form a planarized surface 25 extending across the memory array region 14 and the peripheral region 16. The semiconductor material 24 remaining at the processing stage of FIG. 5 has a thickness 27. Such thickness may be any suitable thickness for the particular circuitry ultimately to be formed across the memory array region; and in some embodiments may be at least about 2000 Å.

The processing of FIGS. 1-5 is one of many examples of processing which may be utilized to form a structure in which the heavily-doped region 22 and the epitaxially-grown material 24 are selectively formed over a memory array region relative to a peripheral region. Another example process for accomplishing such structure is described with reference to FIGS. 6-8.

Figure 6:
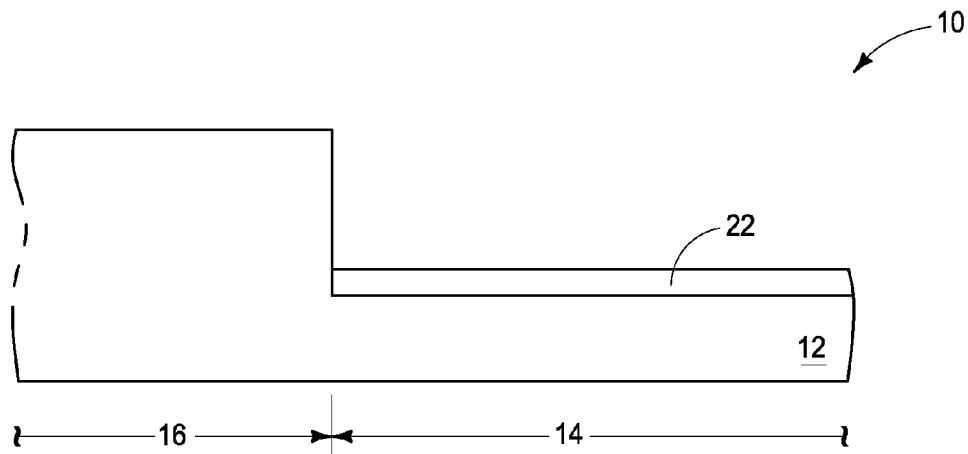
FIG. 6 is a diagrammatic cross-sectional view of the portion of the semiconductor construction shown in FIG. 1 showing a process stage subsequent to that shown in FIG. 5 for the example embodiment method for forming a heavily-doped region and epitaxially-grown semiconductor material over a memory array region selectively relative to a region peripheral to the memory array region.

Referring to FIG. 6, construction 10 is shown at a processing stage subsequent to that of FIG. 3; and specifically is shown after removal of masking material 18 (FIG. 3). The masking material may be removed with any suitable processing, depending on the thickness and composition of the masking material.

Figure 7:
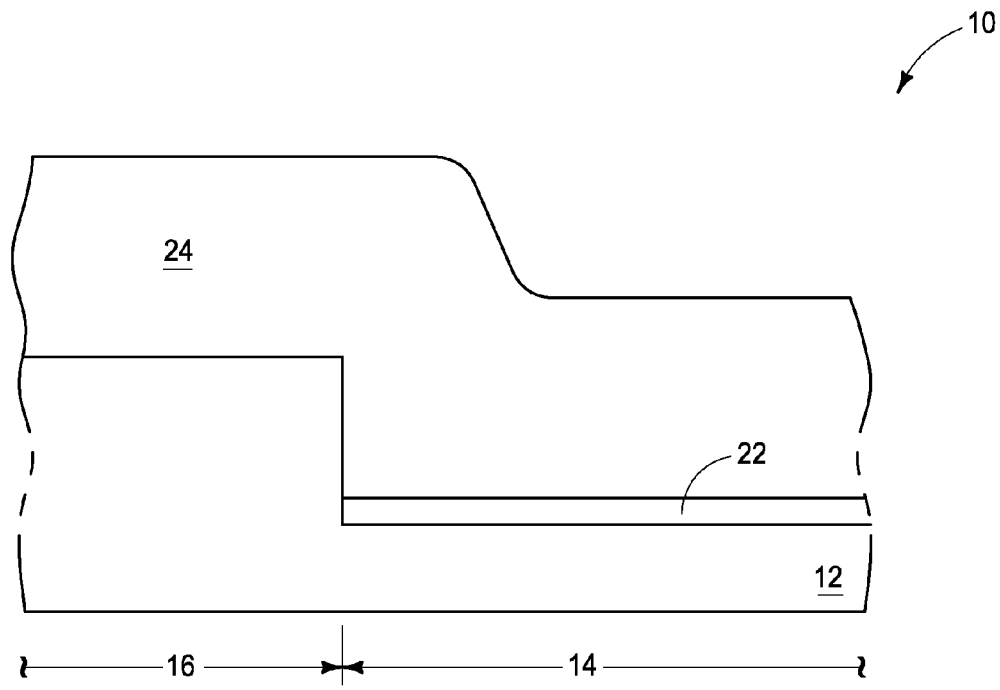
FIG. 7 is diagrammatic cross-sectional view of a portion of a semiconductor construction showing an initial process stage of another example embodiment method for forming a heavily-doped region and epitaxially-grown semiconductor material over a memory array region selectively relative to a region peripheral to the memory array region.
Figure 8:
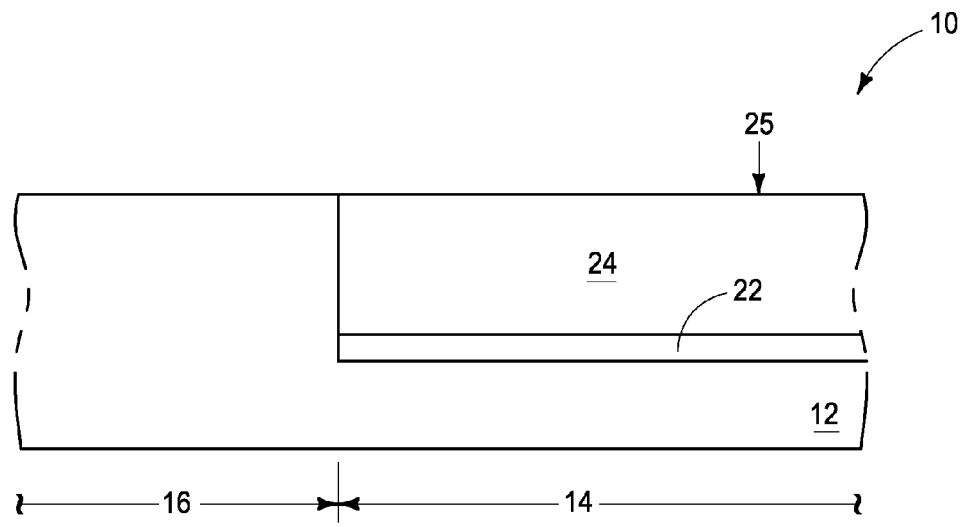
FIG. 8 is diagrammatic cross-sectional view of a portion of a semiconductor construction showing a process stage subsequent to FIG. 7 of the another example embodiment method for forming a heavily-doped region and epitaxially-grown semiconductor material over a memory array region selectively relative to a region peripheral to the memory array region.

Referring to FIG. 7, the semiconductor material 24 is epitaxially grown over exposed surfaces of base 12, and in the shown embodiment is formed over both the memory array region 14 and the peripheral region 16. The semiconductor material 24 is shown formed to a sufficient thickness so that it entirely fills the recess over the memory array region 14. The construction of FIG. 7 may be utilized as is for subsequent fabrication of circuit components. In other embodiments, the construction of FIG. 7 may be subjected to planarization (for instance, CMP) to remove semiconductor material 24 from over peripheral region 16 and form the construction of FIG. 8 having a planarized surface 25 extending across the memory array and peripheral regions prior to fabricating circuit components from the epitaxially-grown material 24. Also, in some embodiments (not shown) the epitaxial growth shown in FIG. 7 may form epitaxially-grown material 24 to a thickness which does not entirely fill the recess over the memory array region, and such material may be utilized for subsequent formation of circuit components without planarization in some embodiments, and with planarization in other embodiments.

In subsequent processing (for instance, processing analogous to that described with reference to FIGS. 9-13), the second semiconductor material 24 may be patterned into circuit components and the heavily-doped region 22 may be patterned into spaced-apart buried lines which electrically couple pluralities of the circuit components to one another. Although the embodiments of FIGS. 1-8 show the heavily-doped region 22 and semiconductor material 24 selectively formed over a memory array region relative to a peripheral region, in other embodiments the heavily-doped region and epitaxially-grown semiconductor material may be formed over other regions alternatively to, or in addition to, the memory array region. For instance, the heavily-doped region and epitaxially-grown semiconductor material may be formed over a peripheral region and utilized for fabrication of logic circuitry. As another example, the heavily-doped region and epitaxially-grown semiconductor material may be utilized for fabrication of sensor circuitry, etc. Accordingly, although specific example embodiments are described below with reference to FIGS. 9-22 for fabrication of memory, it is to be understood that in other embodiments analogous processing may be utilized to fabricate other types of circuitry.

Figure 9:
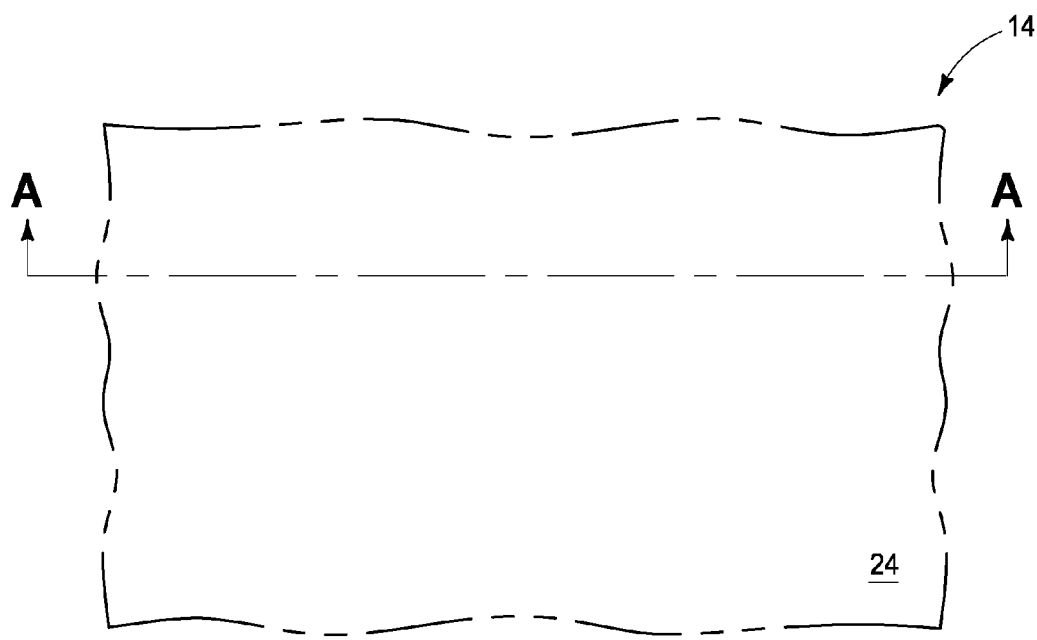
FIG. 9 is a diagrammatic top view of a memory array region.
Figure 10:
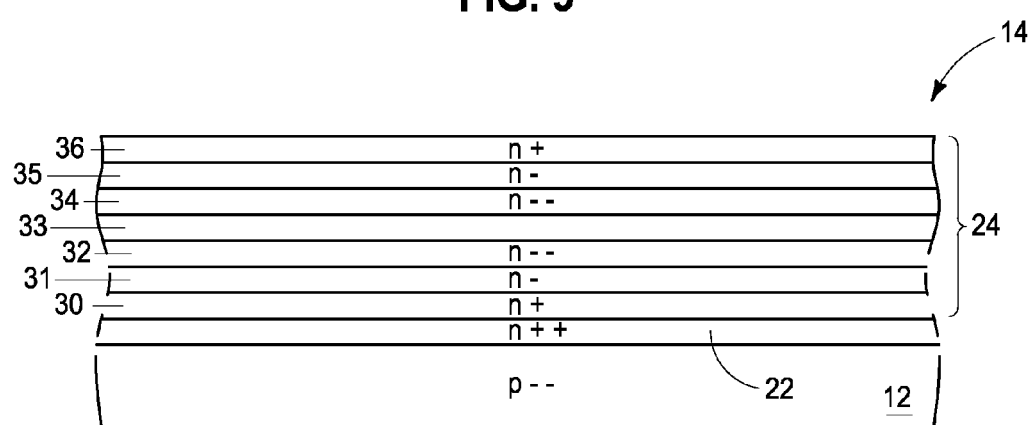
FIG. 10 is a diagrammatic cross-sectional view along the line A-A of FIG. 9 in accordance with an example embodiment in which an epitaxially-grown semiconductor material comprises various doped regions.

Referring to FIGS. 9 and 10, the memory array region 14 is shown at an example embodiment processing stage following the growth of the second semiconductor material 24. FIG. 9 is a top view of a portion of region 14, and FIG. 10 is a cross-sectional view along the line A-A of FIG. 9. The memory array region 14 of FIGS. 9 and 10 may correspond to the processing stage of FIG. 5, FIG. 7 or FIG. 8, in some embodiments.

The base 12 (i.e., the first semiconductor material) of FIG. 10 is shown to be doped to a p-- dopant level, and the heavily-doped region 22 is shown to be doped to an n++ dopant level. The second semiconductor material 24 is shown to comprise a stack of doped regions 30-36. The doped regions 30-36 may be ultimately incorporated into vertical transistors; with the regions 30 and 36 being incorporated into bottom and top source/drain regions of such transistors. The region 33 may be within channel regions of such transistors (such as example vertical transistors shown in FIGS. 20 and 21), and may be lightly doped with appropriate threshold voltage dopant. The regions 31 and 32 form a graded junction between the n++ doped region 30 and the region 33, and similarly the regions 34 and 35 form a graded junction between the n++ doped region 36 and the region 33. The graded junctions may improve device performance relative to vertical transistors having more abrupt junctions between the source/drain regions and the channel region (for instance, there may be reduced junction leakage in vertical transistors having the graded junctions of FIG. 10 relative to vertical transistors having more abrupt junctions).

The doped regions 30-36 may be formed within second semiconductor material 24 with any suitable processing. In some embodiments, such doped regions may be formed by in situ doping of the second semiconductor material during epitaxial growth of such material. In other embodiments, one or more of the doped regions may be formed by implanting appropriate dopant into material 24. However, in some embodiments it may be preferred to utilize in situ doping during the epitaxial growth rather than the dopant implant due to a possibility that the dopant implant may impart undesired damage to material 24.

The various doped regions shown in FIG. 10 are example doped regions, and other doped regions may be utilized in other embodiments. For instance, in some embodiments the n-type and p-type doped regions may be reversed.

Figure 11:
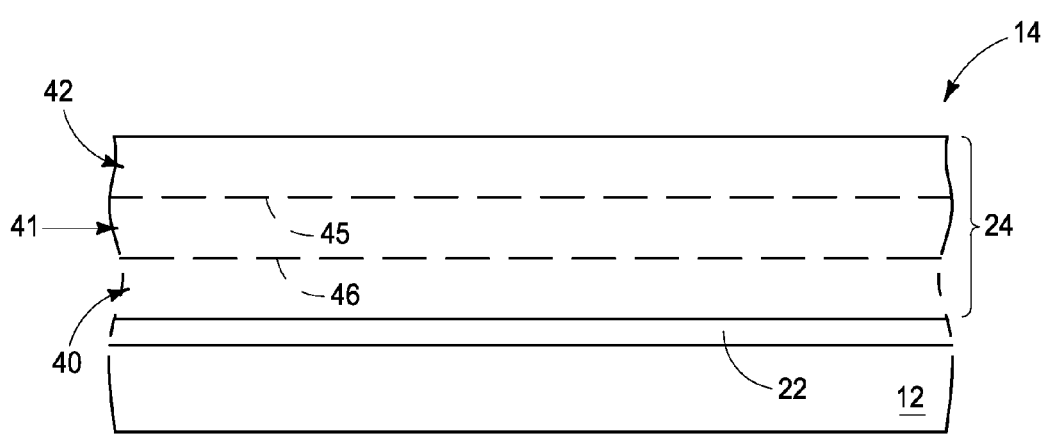
FIG. 11 is another diagrammatic cross-sectional view along the line A-A of FIG. 9 using another method for illustrating various doped regions within the epitaxially-grown semiconductor material.

FIG. 11 shows an alternate and simplified view along the cross-section A-A of FIG. 9. Specifically, FIG. 11 does not indicate specific dopant levels within the various regions; and instead of showing all of the regions 31-36 (FIG. 10) within epitaxially-grown semiconductor material 24, the figure indicates that the epitaxially-grown semiconductor material comprises a stack of doped regions which include a lower source/drain region 40, an upper source/drain region 42, and channel region 41 between the source/drain regions 40 and 42. Dashed-lines 43 and 45 are provided to show approximate boundaries between the channel region and the source/drain regions. The illustration of FIG. 11 generically encompasses embodiments having the graded junction regions of FIG. 10, and also encompasses embodiments having a different number of doped regions than is shown in FIG. 10 (such different number may be greater than the number shown in FIG. 10 in some embodiments, and less than the number shown in FIG. 10 in other embodiments). The drawing style of FIG. 11 will be utilized for illustrating example processing which may be used to pattern heavily-doped region 22 and semiconductor material 24 (specifically, processing described below with reference to FIGS. 12-20).

Figure 12:
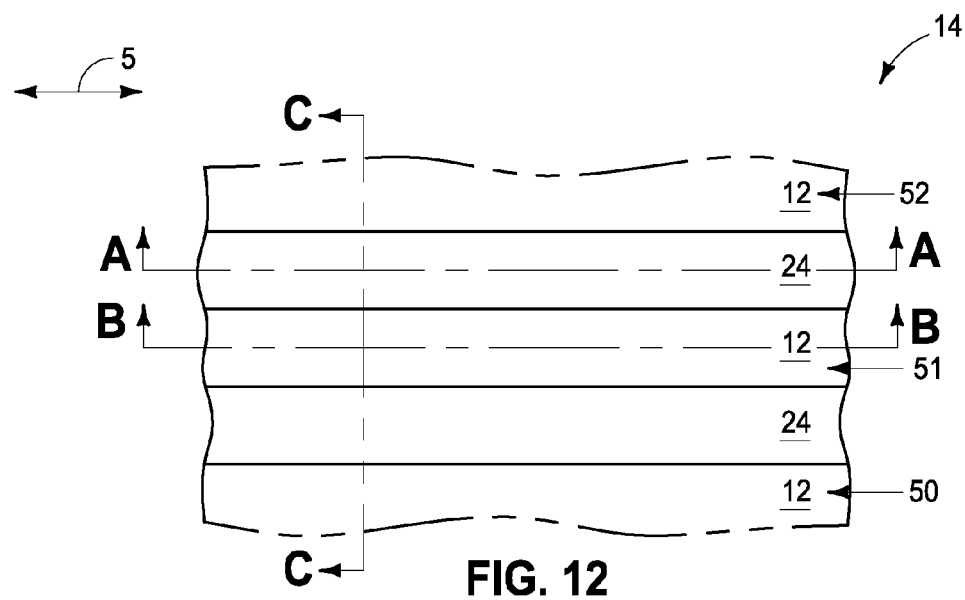
FIG. 12 is a diagrammatic top view of the memory array region of FIG. 9 shown at a processing stage subsequent to that of FIG. 9 in accordance with an example embodiment.
Figure 13:
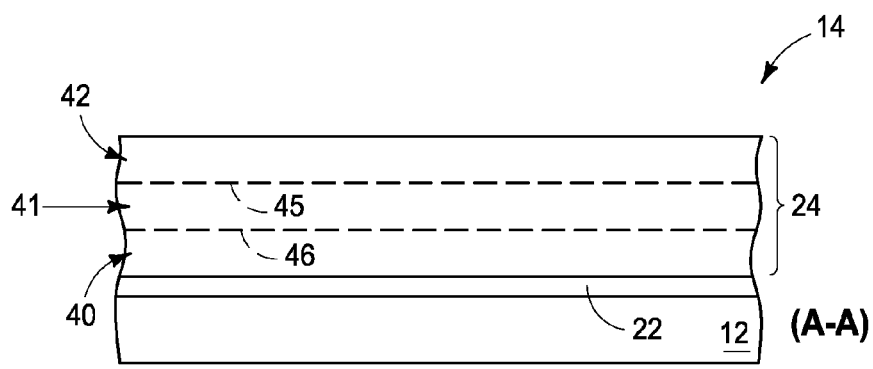
FIG. 13 is a diagrammatic cross-sectional view along the lines A-A of FIG. 12.
Figure 14:
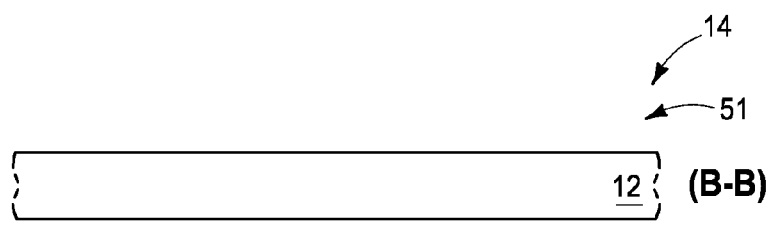
FIG. 14 is a diagrammatic cross-sectional view along the lines B-B of FIG. 12.
Figure 15:
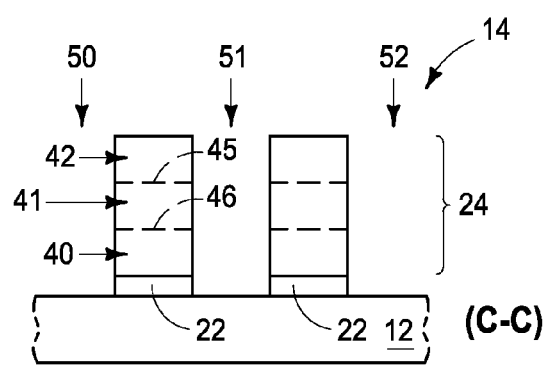
FIG. 15 is a diagrammatic cross-sectional view along the lines C-C of FIG. 12.

FIGS. 12-15 show region 14 at a processing stage subsequent to that of FIGS. 9-11. FIG. 12 is a top view of region 14, and FIGS. 13-15 are cross-sectional views along the lines A-A, B-B and C-C of FIG. 12, respectively.

FIGS. 12-15 show a first series of trenches 50-52 formed to extend through the semiconductor material 24 and heavily-doped region 22. Although the shown trenches 50-52 pass through heavily-doped region 22 and stop at a top surface of substrate 12 beneath the heavily-doped region, in other embodiments the trenches 50-52 may extend into substrate 12 after punching through the heavily-doped region 22.

The trenches 50-52 are shown to be linear trenches extending along a direction of an axis 5 (shown in FIG. 12). Although the trenches are shown to extend straight along axis 5, in other embodiments the trenches 50-52 may be curved or wavy configurations extending primarily along axis 5.

Figure 16:
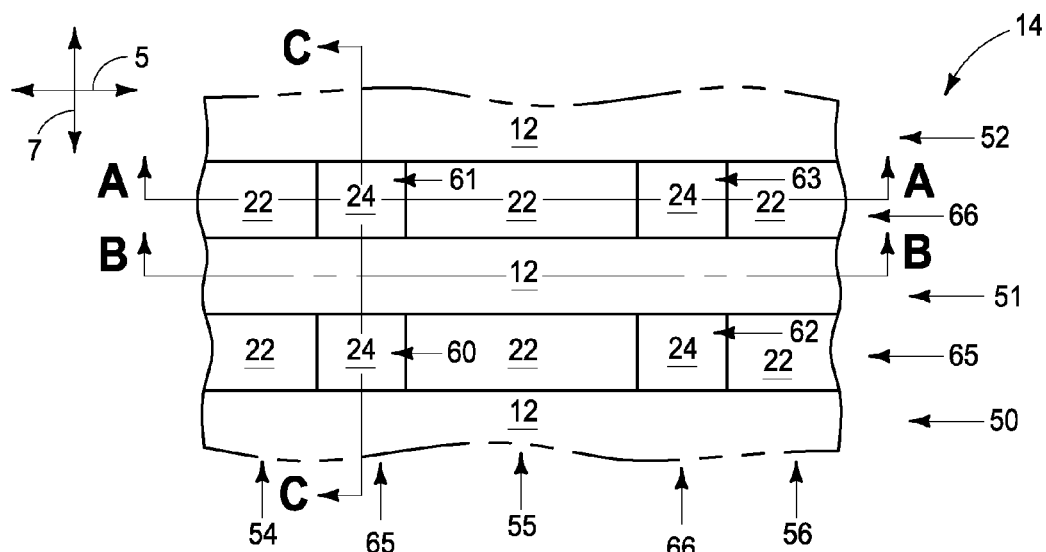
FIG. 16 is a diagrammatic top view of the memory array region of FIG. 9 shown at a processing stage subsequent to that of FIG. 12 in accordance with an example embodiment.
Figure 17:
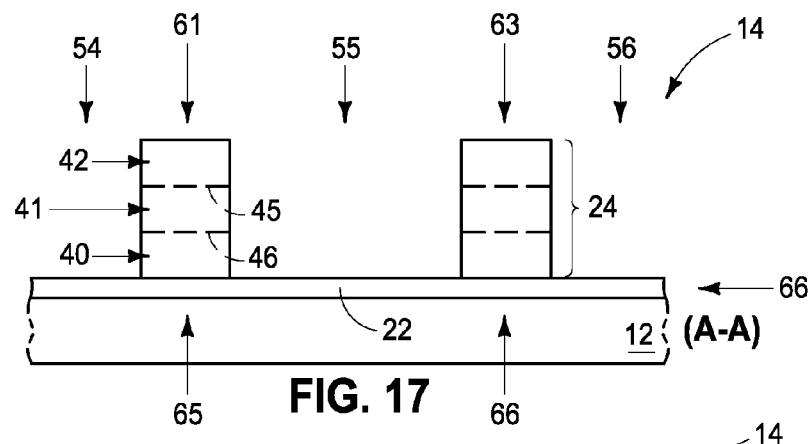
FIG. 17 is a diagrammatic cross-sectional view along the line A-A of FIG. 16.
Figure 18:
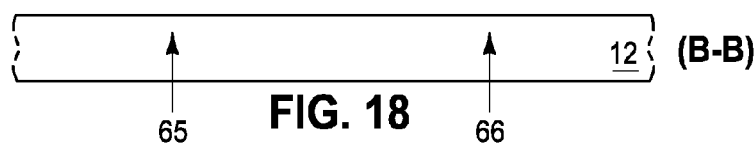
FIG. 18 is a diagrammatic cross-sectional view along the line B-B of FIG. 16.
Figure 19:
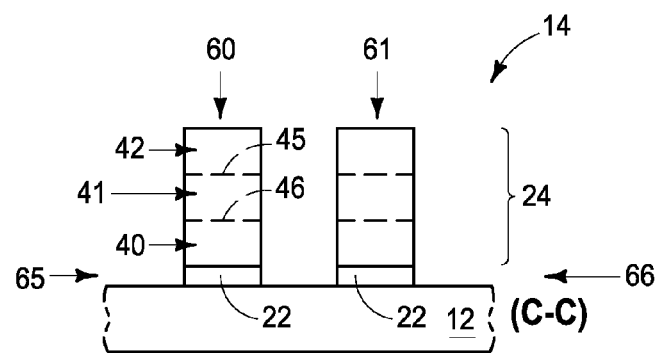
FIG. 19 is a diagrammatic cross-sectional view along the line C-C of FIG. 16.

FIGS. 16-19 show region 14 at a processing stage subsequent to that of FIGS. 12-15. FIG. 16 is a top view of region 14, and FIGS. 17-19 are cross-sectional views along the lines A-A, B-B and C-C of FIG. 16, respectively.

FIGS. 16-19 show a second series of trenches 54-56 formed to extend through the semiconductor material 24. The trenches 54-56 may be referred to as second trenches to distinguish them from the first trenches 50-52. The second trenches 54-56 do not penetrate entirely through the heavily-doped region 22.

The trenches 54-56 are shown to be linear trenches extending along a direction of an axis 7 (shown in FIG. 16). Although the trenches are shown to extend straight along axis 7, in other embodiments the trenches 54-56 may be curved or wavy configurations extending primarily along axis 7.

The trenches 54-56 extend along a direction which intersects the trenches 50-52 as indicated by the axis 7 crossing the axis 5. In the shown embodiment, the trenches 54-56 extend along a direction substantially orthogonal to the direction of the trenches 50-52 as indicated by the axis 7 being substantially orthogonal to the axis 5. The term "substantially orthogonal" is utilized to indicate that the described features are orthogonal to within reasonable tolerances of fabrication and measurement. In other embodiments (not shown), the trenches 54-56 may intersect the trenches 50-52 without being orthogonal to the trenches 50-52.

The first trenches 50-52 and second trenches 54-56 together pattern the second semiconductor material 24 into a plurality of vertically-extending pillars 60-63. Additionally, the first trenches 50-52 pattern the heavily-doped region 22 into spaced-apart lines 65 and 66 which electrically couple pluralities of the vertically-extending pillars to one another (specifically, line 65 electrically couples pillars 60 and 62 to one another, and the line 66 of electrically couples pillars 61 and 63 to one another). The lines 65 and 66 may be referred to as buried lines, in that they are under pillars 60-63. In some embodiments, the lines 65 and 66 may be incorporated into buried digit lines.

The trenches 50-52 may be formed before or after the trenches 54-56. Accordingly, in some embodiments the so-called "first trenches" may be formed after the so-called "second trenches," rather than being formed before the second trenches.

The pillars 60-63 are example circuit components which may be patterned from semiconductor material 24 and interconnected utilizing lines patterned from heavily-doped region 22. In other embodiments, other circuit components may be patterned from semiconductor material 24 and interconnected with lines patterned from region 22. Such circuit components may be any suitable circuit components, including, for example, diodes, BJTs, etc.

In some embodiments, counter-dopant may be provided in base 12 along the bottoms of trenches 50-52 to alleviate possible crosstalk between adjacent conductive lines formed from the heavily-doped region (for instance, lines 65 and 66). For instance, if region 22 is n-type doped, p-type doped regions (not shown) may be formed within base 12 at the bottoms of trenches 50-52.

Figure 20:
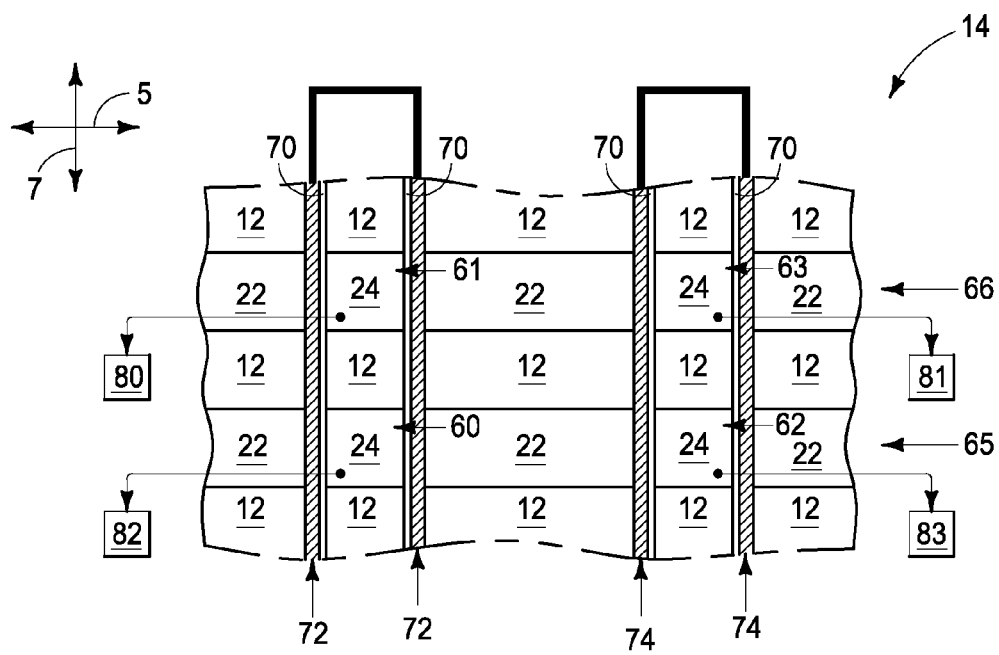
FIG. 20 is a diagrammatic top view of the memory array region of FIG. 9 shown at a processing stage subsequent to that of FIG. 16 in accordance with an example embodiment.

FIG. 20 shows a top view of region 14 at a processing stage subsequent to that of FIGS. 16-19. Gate dielectric 70 is formed along sidewalls of pillars 60-63. Gatelines 72 and 74 extend across channel regions of the pillars 60-63, with the gatelines being spaced from the pillars by the gate dielectric 70. The gate dielectric may comprise any suitable composition or combination of compositions; and in some embodiments may comprise, consist essentially of, or consist of one or both of silicon dioxide and silicon nitride. The gatelines may comprise any suitable electrically conductive composition or combination of compositions; and in some embodiments may comprise one or more of various metals, metal-containing compositions, and conductively-doped semiconductor materials.

In the shown embodiment, the gate dielectric is formed along two sides of each pillar. In other embodiments, the gate dielectric may have a different configuration, and may, for example, entirely surround pillars. Similarly, although the gatelines are shown to extend along two sides of the pillars, in other embodiments the gatelines may have other configurations, and may, for example, entirely surround pillars.

In the shown embodiment, the gatelines 72 and 74 are substantially orthogonal to the buried lines 65 and 66 formed from the heavily-doped region 22.

Each of pillars 60-63 is incorporated into a vertical transistor in the embodiment of FIG. 20, with each vertical transistor being uniquely addressed through a combination of a buried line and a gateline (for instance, the transistor comprising pillar 61 is uniquely addressed through the combination of buried line 66 and gateline 72).

Data storage devices 80-83 are formed over vertical transistors comprising pillars 60-63, respectively. The data storage devices may be electrically coupled with the top source/drain regions 42 (FIG. 17) of the vertical transistors. In some embodiments, the vertical transistors may be incorporated into DRAM, and the data storage devices may correspond to capacitors or other charge-storage devices. In some embodiments, the vertical transistors may be utilized as access devices, and the data storage devices may correspond to RRAM unit cells. In some embodiments, the vertical transistors may be utilized as access devices and incorporated into integrated circuitry having peripheral dimensions of about $4F^2$, where "F" is a minimum feature size that can be patterned with the fabrication technology utilized to form such integrated circuitry.

There may be one or more insulative materials formed over and between the various structures shown at the processing stage of FIG. 20. Such insulative materials are not shown in order to simplify the drawing.

Figure 21:
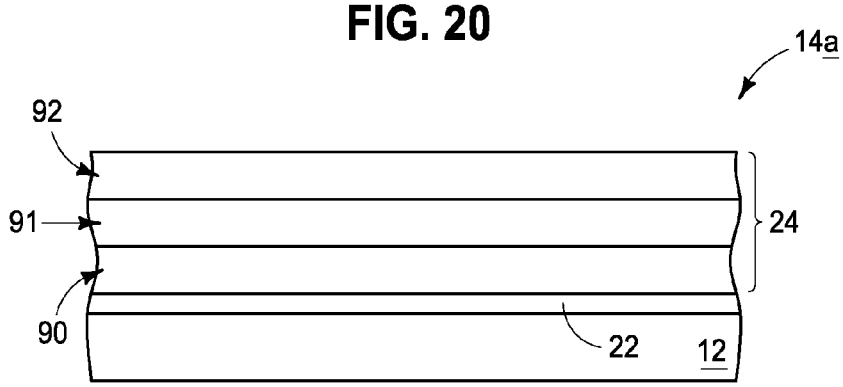
FIG. 21 shows a diagrammatic cross-sectional view of a construction in accordance with another example embodiment; with FIG. 21 being a view along the line A-A shown in FIG. 12.
Figure 22:
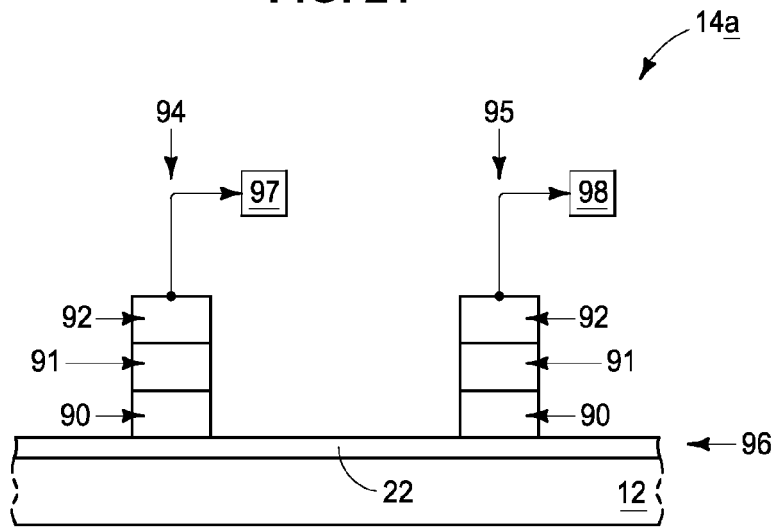
FIG. 22 shows a processing stage following that of FIG. 21.

The vertical transistors of FIG. 20 are examples of integrated circuitry that may be fabricated from epitaxially-grown material 24, and interconnected with lines formed from heavily-doped region 22. Any other suitable integrated circuitry may be fabricated with analogous processing. FIGS. 21 and 22 describe processing which may be utilized to form diode and/or BJT select devices.

Referring to FIG. 21, a memory array region 14a is shown at a processing step which may be analogous to that of FIG. 11. The region includes heavily-doped region 22 over base 12, and includes epitaxially-grown semiconductor material 24 over the heavily-doped region. The material 24 comprises a stack of three regions 90, 91 and 92. The regions may be appropriately doped to form BJT devices. Accordingly, regions 90 and 92 may be doped to be emitter/collector regions, and region 91 may be doped to be a base region. Thus, in some embodiments regions 90 and 92 may be oppositely doped to region 91 (specifically, regions 90 and 92 may be n-type doped while region 91 is p-type doped, or vice versa). Alternatively, the regions 90-92 may be appropriately doped to form diodes. For instance, the regions 90-92 may be appropriately doped to form PIN diodes. Accordingly, one of regions 90 and 92 may be n-type doped and the other p-type doped; and the region 91 may be intrinsically doped.

FIG. 22 shows construction 14a after utilizing first and second trenches analogous to those described above with reference to FIGS. 12-19 to pattern pillars 94 and 95 comprising the doped regions 90-92. Such pillars are connected to one another by a patterned line 96 comprising heavily-doped region 22. In some embodiments, the pillars 94 and 95 may be diodes or BJTs; and may be utilized as select devices. For instance, FIG. 22 shows the pillars 94 and 95 electrically connected with integrated circuit components 97 and 98, respectively. Such components may be electrically coupled with the top regions 92 of the pillars. In some embodiments, components 97 and 98 may correspond to RRAM cells. In some example applications of such embodiments, the unit cells and select devices may be incorporated into $4F^2$ architecture.

FIGS. 1-22 illustrate example processes of epitaxially growing semiconductor material over a heavily-doped region, and then patterning the epitaxially-grown material into circuit components while also patterning the region into buried conductive lines interconnect pluralities of the components to one another. In some embodiments, such processing may be utilized to form highly conductive doped lines which are buried under the circuit components, with the lines having width dimensions aligned with the width dimensions of the components.

The processing of FIGS. 1-22 illustrates a few of many examples of processing which may be utilized to form a structure in which the heavily-doped region 22 is selectively formed over a memory array region relative to a peripheral region. Another example process for accomplishing such structure is described with reference to FIGS. 23-26.

Figure 23:
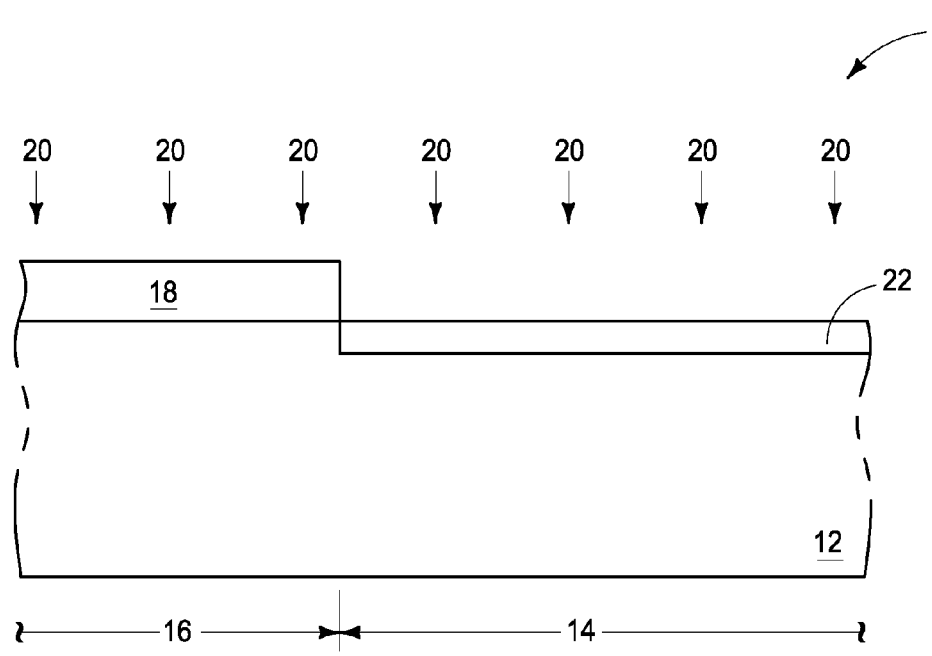
FIG. 23 is a diagrammatic cross-sectional view of a portion of a semiconductor construction showing a process stage of another example embodiment method for forming a heavily-doped region.

Referring to FIG. 23, construction 10 is shown at a processing stage subsequent to that of FIG. 1; and specifically is shown as dopant 20 is implanted into memory array region 14 while peripheral region 16 is protected with masking material 18. The implanted dopant forms the heavily-doped region 22 within base 12.

Figure 24:
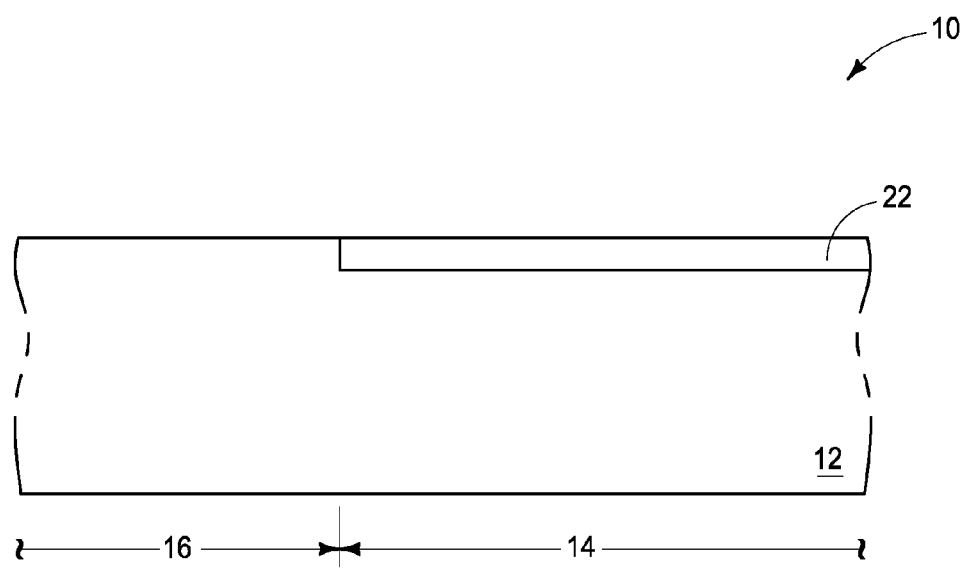
FIG. 24 is a diagrammatic cross-sectional view of the portion of the semiconductor construction of FIG. 23 showing a process stage subsequent to FIG. 23.

Referring to FIG. 24, masking material 18 is removed.

Figure 25:
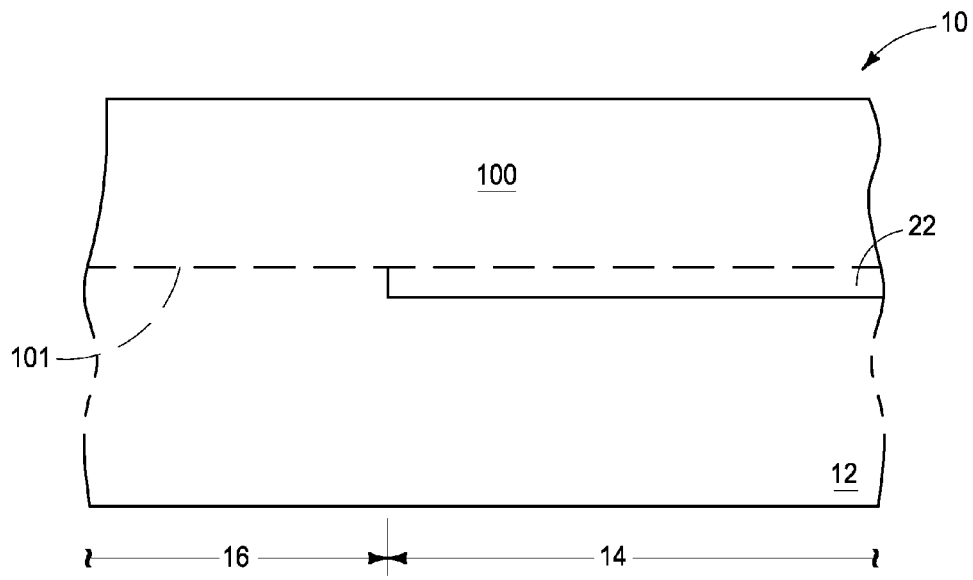
FIG. 25 is a diagrammatic cross-sectional view of the portion of the semiconductor construction of FIG. 23 showing a process stage subsequent to FIG. 24.
Figure 26:
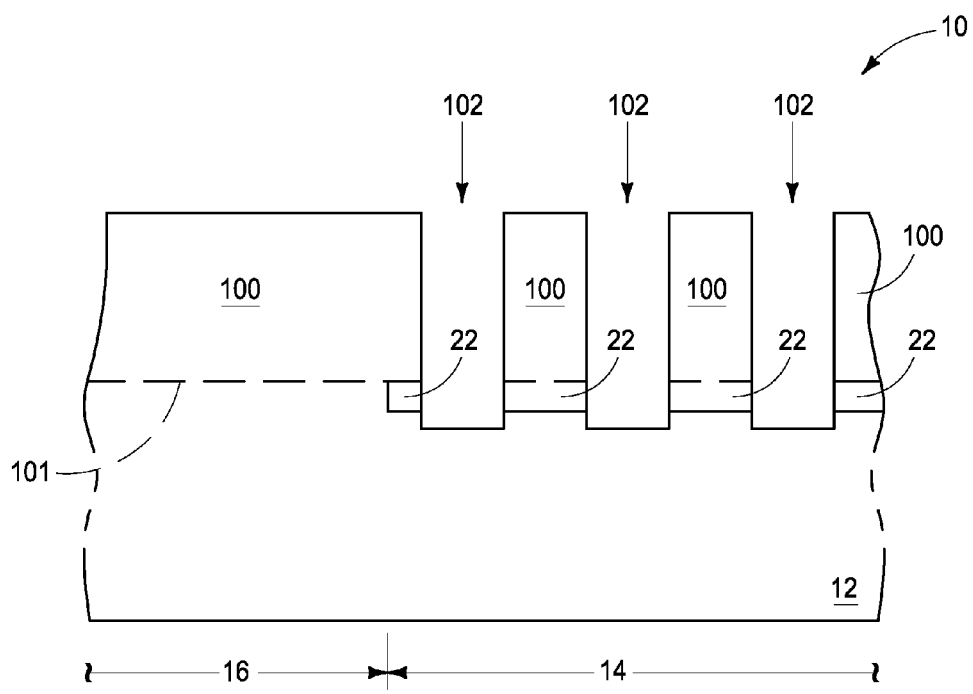
FIG. 26 is a diagrammatic cross-sectional view of the portion of the semiconductor construction of FIG. 23 showing a process stage subsequent to FIG. 25.

Referring to FIG. 25, semiconductor material 100 is epitaxially grown over exposed surfaces of base 12, and in the shown embodiment is formed over both the memory array region 14 and the peripheral region 16. A dashed line 101 is provided to illustrate an approximate boundary between material 100 and base 12. The semiconductor material 100 may be any suitable composition, and in some embodiments may comprise, consist essentially of, or consist of silicon. The construction of FIG. 25 may be utilized for subsequent fabrication of circuit components. For instance, FIG. 26 shows the construction at a processing stage after trenches 102 have been formed into the memory array region 14 to subdivide the doped region 22 into a plurality of electrically conductive segments. Such segments may be utilized as bitlines or wires in some embodiments. For instance, the embodiment of FIG. 26 may comprise trenches analogous to those described above with reference to FIGS. 12-22. In some embodiments, material 100 may comprise numerous doped regions, such as, for example, regions analogous to those shown in FIG. 10 as being within material 24.

Although the peripheral region 16 of FIGS. 1-26 is shown to be homogenous, in some embodiments such peripheral region may be subjected to circuit-forming processing prior to formation of doped region 22 in the memory array region 14. For instance, in some embodiments a gate stack may be formed across the peripheral region before the formation of doped region 22 and the epitaxial growth over such doped region.

The integrated circuitry discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a method of forming a semiconductor construction. A heavily-doped region is formed within a first semiconductor material. A second semiconductor material is epitaxially grown over the first semiconductor material. The second semiconductor material is patterned to form circuit components. The heavily-doped region is patterned to form spaced-apart buried lines electrically coupling pluralities of the circuit components to one another. At least some of the patterning of the heavily-doped region occurs simultaneously with at least some of the patterning of the second semiconductor material.

In some embodiments, the invention includes a method of forming a semiconductor construction. A memory array region of a semiconductor substrate is recessed relative to a region of the substrate peripheral to the memory array region. A heavily-doped region is formed within the recessed memory array region. Semiconductor material is epitaxially grown over the heavily-doped region. The semiconductor material is patterned to form circuit components. The heavily-doped region is patterned to form spaced-apart buried lines electrically coupling pluralities of the circuit components to one another. At least some of the patterning of the heavily-doped region occurs simultaneously with at least some of the patterning of the semiconductor material.

In some embodiments, the invention includes a method of forming a memory array. A heavily-doped region is formed within a first semiconductor material. A second semiconductor material is epitaxially grown over the first semiconductor material. The second semiconductor material is in situ doped during the epitaxial growth to form a stack of doped regions over the heavily-doped region. First trenches are formed through the second semiconductor material. The first trenches extend along a first direction and penetrate entirely through the heavily-doped region. Second trenches are formed through the second semiconductor material. The second trenches extend along a second direction which intersects the first direction, and do not penetrate entirely through the heavily-doped region. The first and second trenches together pattern the second semiconductor material into a plurality of vertically-extending pillars comprising the stacked doped regions, and pattern the heavily-doped region into a plurality of buried lines under the pillars. The buried lines electrically interconnect pluralities of the pillars to one another. Data storage devices are formed over the vertically-extending pillars and are electrically coupled with top doped regions of the stacked doped regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory array, comprising:
    providing a base comprising a first semiconductive material, the base having an memory array region and a peripheral region;
    forming a planar recessed upper surface of the array region, the upper surface of the array region being recessed relative to uppermost surfaces of the base in the peripheral region;
    forming a heavily-doped region within the first semiconductor material in the array region;
    epitaxially growing a second semiconductor material over the first semiconductor material; the second semiconductor material being in situ doped during the epitaxial growth to form a stack of doped regions over the heavily-doped region;
    forming first trenches through the second semiconductor material; the first trenches extending along a first direction, and penetrating entirely through the heavily-doped region;
    forming second trenches through the second semiconductor material, the second trenches extending along a second direction which intersects the first direction, and not penetrating entirely through the heavily-doped region; the first and second trenches together patterning the second semiconductor material into a plurality of vertically-extending pillars comprising the stacked doped regions, and patterning the heavily-doped region into a plurality of buried lines under the pillars; the buried lines electrically interconnecting pluralities of the pillars to one another; and
    forming data storage devices over the vertically-extending pillars and electrically coupled with top doped regions of the stacked doped regions.

2. The method of claim 1 wherein the first trenches are formed before the second trenches.

3. The method of claim 1 wherein the second trenches are formed before the first trenches.

4. The method of claim 1 wherein the heavily-doped region is n-type.

5. The method of claim 1 wherein the heavily-doped region is p-type.

6. The method of claim 1 wherein the stack comprises a lower source/drain region, a channel region and an upper source/drain region in ascending order from the heavily-doped region; and further comprising:
    forming gatelines along the pillars, the gatelines extending across pluralities of channel regions; each pillar being incorporated into a vertical transistor uniquely addressed through a combination of a buried line and a gateline; and
    forming the data storage devices over the vertical transistors and electrically coupled with the top source/drain regions of the vertical transistors.

7. The method of claim 6 wherein the data storage devices are capacitors and the memory array is a DRAM array with individual memory cells of the array comprising one of the vertical transistors coupled with one of the capacitors.

8. The method of claim 1 wherein the data storage devices are memory cells, and wherein the vertically-extending pillars are incorporated into access devices electrically coupled with the memory cells.

9. The method of claim 8 wherein the stack comprises a lower emitter/collector region, a base region and an upper emitter/collector region in ascending order from the heavily doped region; and wherein the vertical pillars are incorporated into BJT access devices.

10. The method of claim 8 wherein the stack comprises a lower source/drain region, a channel region and an upper source/drain region in ascending order from the heavily-doped region; and wherein the vertical pillars are incorporated into vertical transistor access devices.

11. The method of claim 8 wherein the stack comprises a first diode region, an intrinsic region and a second diode region in ascending order from the heavily-doped region; and wherein the vertical pillars are incorporated into diode access devices.

12. The method of claim 1 wherein the heavily-doped region is formed by:
   implanting conductivity enhancing dopant into the first semiconductor material in combination with one or both of carbon and nitrogen to form an implant region within the first semiconductor material; and
   thermally treating the implant region to heal damage imparted during the implant.

13. The method of claim 1 wherein the heavily-doped region extends to a depth within the first semiconductor material of less than or equal to about 100 nanometers.

14. The method of claim 1 wherein the second semiconductor material is epitaxially grown to a thickness of at least about 2000Å.

15. The method of claim 1 wherein the second trenches are substantially orthogonal to the first trenches.

16. A method of forming a semiconductor construction, comprising:
   forming a heavily-doped region within a first semiconductor material in an array region of a base, the array region having a planar upper surface that is recessed relative to uppermost surfaces of a peripheral region of the base;
   epitaxially growing a second semiconductor material over the first semiconductor material;
   patterning the second semiconductor material to form circuit components;
   patterning the heavily-doped region to form spaced-apart buried lines electrically coupling pluralities of the circuit components to one another; and
   at least some of the patterning of the heavily-doped region occurring simultaneously with at least some of the patterning of the second semiconductor material.

17. The method of claim 16 wherein the heavily-doped region is n-type.

18. The method of claim 16 wherein the heavily-doped region is p-type.

19. The method of claim 16 wherein the first semiconductor material is monocrystalline silicon.

20. The method of claim 16 wherein the first and second semiconductor materials are monocrystalline silicon.

21. The method of claim 16 further comprising in situ doping of the second semiconductor material during the epitaxial growth of the second semiconductor material.

22. The method of claim 16 wherein the circuit components are vertical transistors.

23. The method of claim 16 wherein the circuit components are BJTs.

24. The method of claim 16 wherein the circuit components are diodes.

* * * * *